United States Patent
Hirao et al.

(10) Patent No.: US 7,891,365 B2
(45) Date of Patent: Feb. 22, 2011

(54) NOZZLE CLEANING APPARATUS, NOZZLE CLEANING METHOD, AND A COMPUTER-READABLE STORAGE MEDIUM STORING NOZZLE CLEANING PROGRAM

(75) Inventors: Takeshi Hirao, Koshi (JP); Akihiro Fujimoto, Koshi (JP); Yasutaka Souma, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 654 days.

(21) Appl. No.: 11/802,423

(22) Filed: May 22, 2007

(65) Prior Publication Data

US 2008/0023034 A1    Jan. 31, 2008

(30) Foreign Application Priority Data

May 23, 2006   (JP) ............................. 2006-142665

(51) Int. Cl.
*B08B 3/04* (2006.01)
(52) U.S. Cl. .................. 134/104.2; 134/60; 134/166 R; 15/3
(58) Field of Classification Search ............ 134/104.1, 134/104.2, 166 R, 198, 186
See application file for complete search history.

(56) References Cited

U.S. PATENT DOCUMENTS

| | | | |
|---|---|---|---|
| 5,089,305 A * | 2/1992 | Ushijima et al. | 427/422 |
| 2003/0138551 A1* | 7/2003 | Miyata | 427/8 |
| 2004/0173153 A1* | 9/2004 | Muramatsu et al. | 118/715 |

FOREIGN PATENT DOCUMENTS

| | | |
|---|---|---|
| JP | 05-309309 | 11/1993 |
| JP | 6-44137 | 6/1994 |

* cited by examiner

*Primary Examiner*—Michael Kornakov
*Assistant Examiner*—Eric Golightly
(74) *Attorney, Agent, or Firm*—Smith, Gambrell & Russell, LLP (57) ABSTRACT

Disclosed are a nozzle cleaning apparatus and a nozzle cleaning method, which are capable of effectively cleaning a nozzle for discharging a process liquid to a substrate, with a simple structure and a low cost. A nozzle 30 is accommodated in a cleaning container 2 having a funnel-shaped portion 2b. A solvent T as a cleaning liquid is supplied along an inner surface of the funnel-shaped portion 2b. The solvent T forms a vortex flow whirling around the nozzle 30. By exposing the nozzle 30 to the vortex flow, the nozzle 30 can be effectively, thoroughly cleaned.

9 Claims, 8 Drawing Sheets

--PRIOR ART--

FIG. 8

NOZZLE CLEANING APPARATUS, NOZZLE CLEANING METHOD, AND A COMPUTER-READABLE STORAGE MEDIUM STORING NOZZLE CLEANING PROGRAM

TECHNICAL FIELD

The present invention relates to a technique for cleaning a nozzle for discharging a process liquid, such as a photoresist, to a substrate.

BACKGROUND ART

In semiconductor device manufacturing, a desired circuit pattern is formed by photolithography that applies a photoresist liquid to a substrate having a predetermined film formed thereon to form a resist film, exposes the resist film with the desired circuit pattern and develops it. More particularly, a wafer as a substrate is subjected to a series of processes including a cleaning process, a dehydration baking process, an adhesion (hydrophobizing) process, a resist coating process, a pre-baking process, an exposure process, a developing process, and a post-baking process.

In a resist coating system that forms a resist film by supplying a photoresist liquid (hereinafter referred simply as "resist") to a wafer, it sometimes occurs that, a resist adhering to the tip of the resist supplying nozzle after discharging the resist dries and solidifies so as to generate crystals. When the resist is further discharged from the nozzle with the crystals still adhering to the tip thereof, a normal resist discharging operation may not be performed, or the crystals may be supplied onto a wafer together with the resist.

As a countermeasure against the above problem, there has been known a technique that creates an atmosphere of a vapor of a solvent, such as a thinner, around a nozzle in the nozzle standby area, so as to suppress drying and solidifying of the resist adhering to the nozzle tip, thereby preventing generation of crystals.

In order to suppress drying and solidifying of the resist, a solvent vapor atmosphere of a high concentration is required. However, when a nozzle is placed in a solvent vapor atmosphere of a high concentration, dew drops are likely to be formed on the outer circumferential surface of the nozzle. If the dew drops fall on a substrate, processing of the substrate may be adversely affected.

Figure 8:
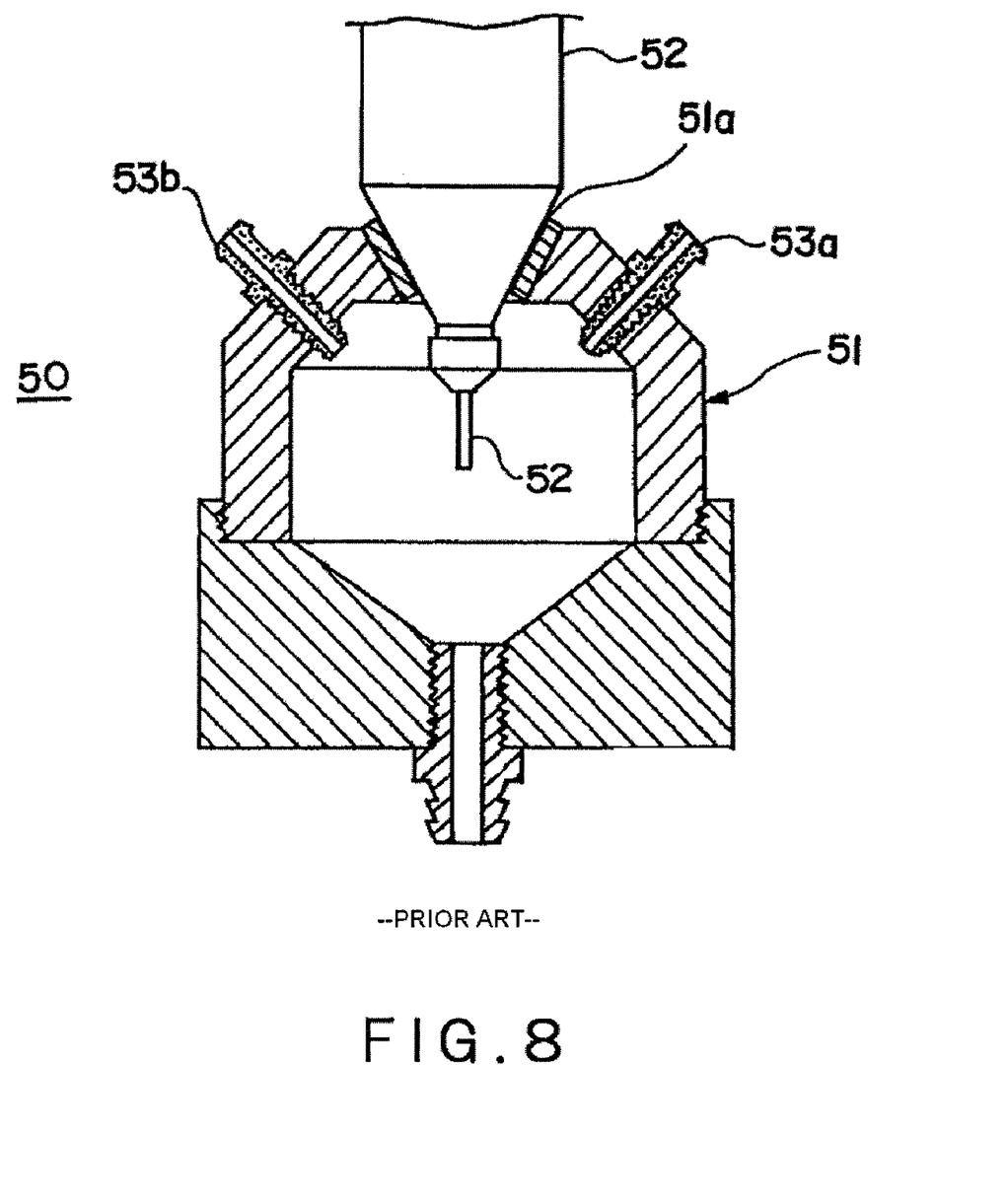
FIG. 8 is a longitudinal sectional view of a conventional nozzle cleaning apparatus.

In addition, adhering matters that have already been crystallized cannot be removed by the above method. In order to remove crystals, a nozzle has to be cleaned with the use of a cleaning liquid. JP5-309309A discloses a nozzle cleaning apparatus that may be used for such a purpose (note that the nozzle cleaning apparatus disclosed herein is a nozzle cleaning apparatus that cleans a nozzle for applying a highly viscous fluid such as adhesive, paint, and grease). FIG. 8 schematically shows the nozzle cleaning apparatus disclosed in JP5-309309A. A syringe (ejector) 52 is fixed in an opening 51a formed in a container 51 so that a nozzle 52a is held in the container 51. A cleaning liquid is jetted from plural cleaning liquid nozzles 53a and 53b toward the applying nozzle 52a.

In the nozzle cleaning apparatus of JP5-309309A, plural (at least two) cleaning liquid nozzles 53a and 53b are required to thoroughly clean the coating nozzle 52a. Further, precise positioning of the coating nozzle 52a is required to allow the cleaning liquid jetted from the cleaning liquid nozzles 53a and 53b to appropriately collide with the coating nozzle 52a. Thus, it is necessary to make the nozzle cleaning apparatus with high precision, which results in an increased apparatus cost.

SUMMARY OF THE INVENTION

The present invention has been made under the foregoing circumstances, and the object of the present invention is to provide a nozzle cleaning technique which is capable of efficiently cleaning a nozzle for discharging a process liquid to a substrate so as to prevent any trouble in the processing of the substrate, and is capable of reducing the cost relating to the cleaning.

In order to achieve the above objective, according to a first aspect of the present invention, there is provided a nozzle cleaning apparatus that cleans a nozzle for discharging a process liquid to a substrate, said apparatus comprising: a cleaning liquid supply unit that supplies a solvent as a cleaning liquid; a cleaning container adapted to accommodate the nozzle therein and defining therein a cleaning chamber, the cleaning container having a part thereof to be located around a tip of the nozzle accommodated in the cleaning container, the part of the cleaning container having an inner surface of a funnel-like shape; and a cleaning liquid supply path connected to the cleaning liquid supply unit and having a supply port opening into the cleaning chamber, the supply port being disposed such that the solvent is supplied along the inner surface of the funnel-like shape so as to form a vortex of the solvent whirling around the nozzle.

In one preferred embodiment, an opening for draining the solvent is formed in a bottom portion of the cleaning container, and an inner diameter of the opening is larger than an outer diameter of the tip of the nozzle. Preferably, the tip of the nozzle is positioned at a level higher than that of an upper end of the opening, when the nozzle is accommodated in the cleaning container.

In one preferred embodiment, the nozzle cleaning apparatus further comprises a solvent atmosphere creating structure that creates a solvent atmosphere in the cleaning chamber, and the structure includes: a channel pipe, disposed below the cleaning container and being in communication with the opening of the cleaning container, through which the solvent drained from the cleaning container flows; and a first solvent reservoir disposed at a lower portion of the channel pipe and adapted to store the solvent, which is flown into the first solvent reservoir from the channel pipe, at a level higher than that of a lower end of the channel pipe, whereby a solvent stored in the first solvent reservoir may be vaporized to enter the cleaning chamber so that a solvent atmosphere is created in the cleaning chamber. Preferably, the solvent atmosphere creating structure further includes a second solvent reservoir disposed above the first solvent reservoir and being in communication with the channel pipe, and the cleaning liquid supply unit is adapted to supply the solvent also to the second solvent reservoir.

According to a second aspect of the present invention, there is provided a nozzle cleaning method that cleans a nozzle for discharging a process liquid to a substrate, the method comprising the steps of: accommodating a nozzle in a cleaning container having an inner surface of a funnel-like shape and defining a cleaning chamber therein, and positioning the nozzle such that the inner surface is located around a tip of the nozzle; and supplying a solvent as a cleaning liquid into the cleaning chamber along the inner surface, thereby forming a vortex of the solvent whirling around the nozzle in the cleaning chamber, and cleaning the nozzle by exposing the nozzle to the vortex.

In one preferred embodiment, the method further comprises a step of storing the solvent at least in a solvent reservoir which is in communication with the cleaning chamber, thereby creating a solvent vapor atmosphere in the cleaning chamber by a solvent vapor generated by vaporization of the solvent in the solvent reservoir. The step of creating the solvent vapor atmosphere may be performed either before or after the step of cleaning the nozzle. At least the one solvent reservoir may be the first solvent reservoir and/or the second solvent reservoir of the solvent atmosphere creating structure in the above-described nozzle cleaning apparatus according to the first aspect. Storing of the solvent into the at least one solvent reservoir can be performed by draining the solvent supplied to the cleaning chamber and by introducing the solvent into the first solvent reservoir. Alternatively or additionally, storing of the solvent into the at least one solvent reservoir may be performed by directly supplying the solvent into the second solvent reservoir from the cleaning liquid supply unit.

In addition, according to a third aspect of the present invention, there is provided a computer-readable storage medium storing a nozzle cleaning program, wherein, upon execution of the nozzle cleaning program by a control computer that controls a nozzle cleaning apparatus or a substrate processing system incorporating the nozzle cleaning apparatus, the control computer controls the nozzle cleaning apparatus or the substrate processing system to perform the foregoing nozzle cleaning method according to the second aspect.

DESCRIPTION OF PREFERRED EMBODIMENTS

Preferred embodiments of a nozzle cleaning apparatus and a nozzle cleaning method according to the present invention will be described below with reference to the accompanying drawings. At first, the overall structure of a resist coating system COT incorporating the nozzle cleaning apparatus in one embodiment of the present invention is described with reference to FIG. 1.

Figure 1:
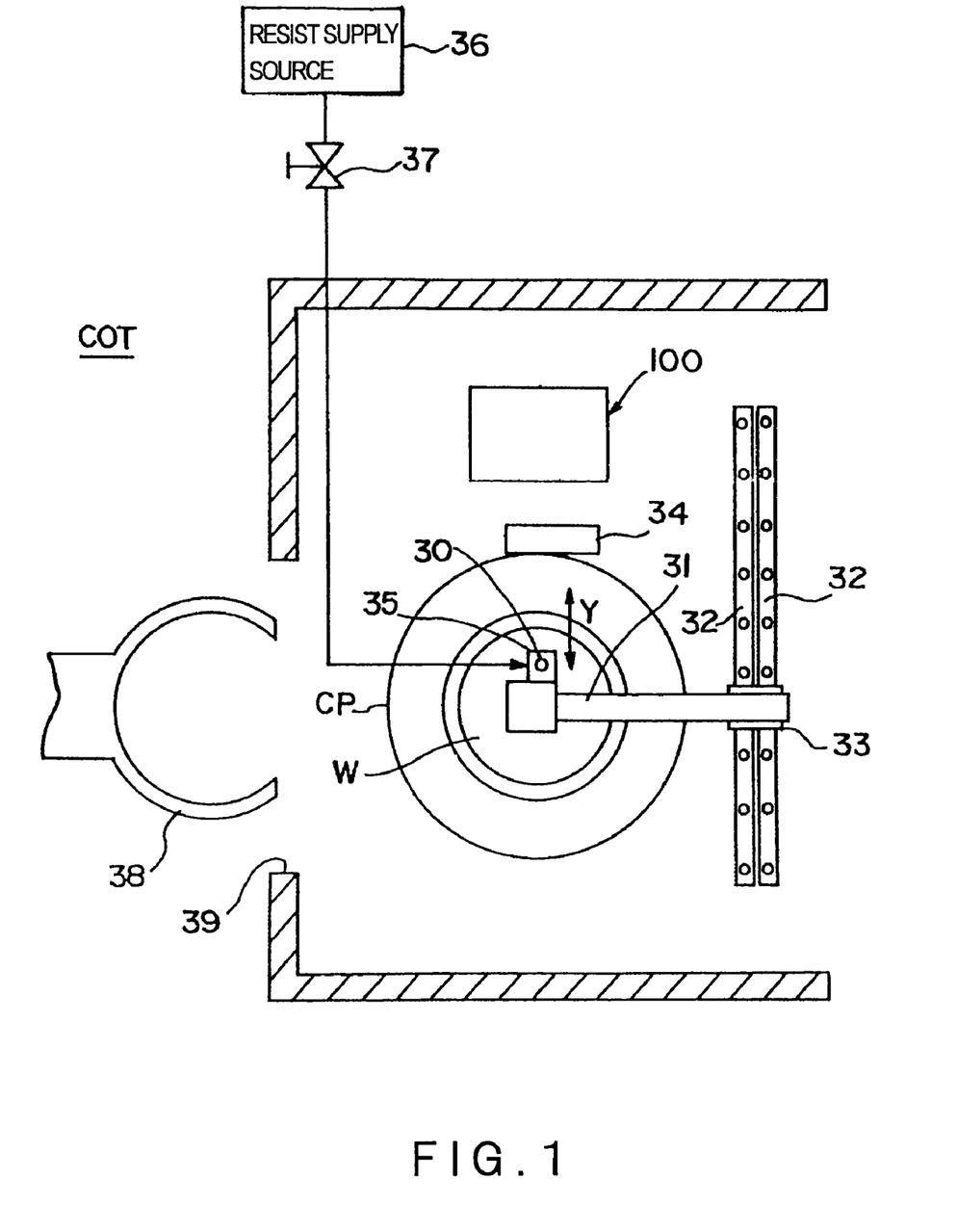
FIG. 1 is a plan view of a resist coating system provided with a nozzle standby part that is structured as a nozzle cleaning apparatus according to the present invention.

An annular cup CP is arranged on a bottom central portion in the resist coating system COT. A spin chuck (which is invisible because the spin chuck is positioned below a wafer W) is disposed inside the cup CP. The spin chuck is driven for rotation by a motor (not shown), while the wafer W is being held on the spin chuck by vacuum chucking.

A photoresist is supplied from a resist supply source 36, through a pipe in which a valve 37 is disposed, into a resist supply nozzle 30 (hereinafter referred to simply as "nozzle 30"), and the photoresist is discharged from a discharge port formed in the tip of the nozzle 30 onto the wafer W.

The nozzle 30 is held on the distal end of a nozzle scan arm 31 through a nozzle holder 35. A nozzle standby part 100 is provided outside the cup CP in the resist coating system COT. In order that the nozzle standby part 100 can clean a nozzle standing-by therein, the nozzle standby part 100 is structured as the nozzle cleaning apparatus according to the present invention. The nozzle scan arm 31 is attached to an upper end part of a vertical supporting member 33, which is capable of horizontally moving along a guide rail 32 laid in Y-direction on a bottom plate of a housing of the resist coating system COT. The nozzle scan arm 31 is moved in the Y-direction together with the vertical supporting member 33 by a not-shown, Y-direction driving mechanism. The nozzle scan arm 31 is also capable of vertically moving by a not-shown, vertical-direction driving mechanism, so as to position the nozzle 30 with respect to the vertical direction when the nozzle 30 is cleaned by the nozzle standby part 100.

In FIG. 1, for simplification of the drawing, a shutter which is disposed at an opening 39 through which a transfer arm 38 enters and exits the resist coating system COT is not illustrated.

Next, a resist coating operation performed in the resist coating system COT is described. Firstly, a wafer W is loaded into the resist coating system COT by the transfer arm 38 through the opening 39, and the wafer W is held by the spin chuck. Then, the nozzle scan arm 31 moves the nozzle 30 from the nozzle standby part 100, such that the discharge port of the nozzle 30 is located at a position above the center of the wafer W.

Thereafter, the wafer W held by the spin chuck is rotated about a vertical axis. By opening the valve 37, a resist is pumped from the resist supply source 36 into the nozzle 30, whereby the resist is discharged from the discharge port of the nozzle 30 onto the rotating wafer W. The resist that has been supplied onto the wafer W is extended over the whole surface of the wafer W by centrifugal force.

After the applying of the resist onto the wafer W is finished, the supply of the resist from the resist supply source 36 is stopped and the valve 37 is closed. At this time, although the discharge port of the nozzle 30 is left opened, since the valve 37 is closed, the resist remaining between the valve 37 and the discharge port of the nozzle 30 will not drop down from the discharge port due to surface tension.

Following thereto, the nozzle scan arm 31 transfers the resist supply nozzle 30 to a position above a drain cup 34. Then, the valve 37 is opened again, so that the resist remaining between the valve 37 and the discharge port of the nozzle 30 is discharged into the drain cup 34. The nozzle 30 is moved by the nozzle scan arm 31 into the nozzle standby part 100 where the nozzle 30 stands by until the next resist application to the wafer W starts. During this standby period, the nozzle is cleaned according to need.

Figure 2:
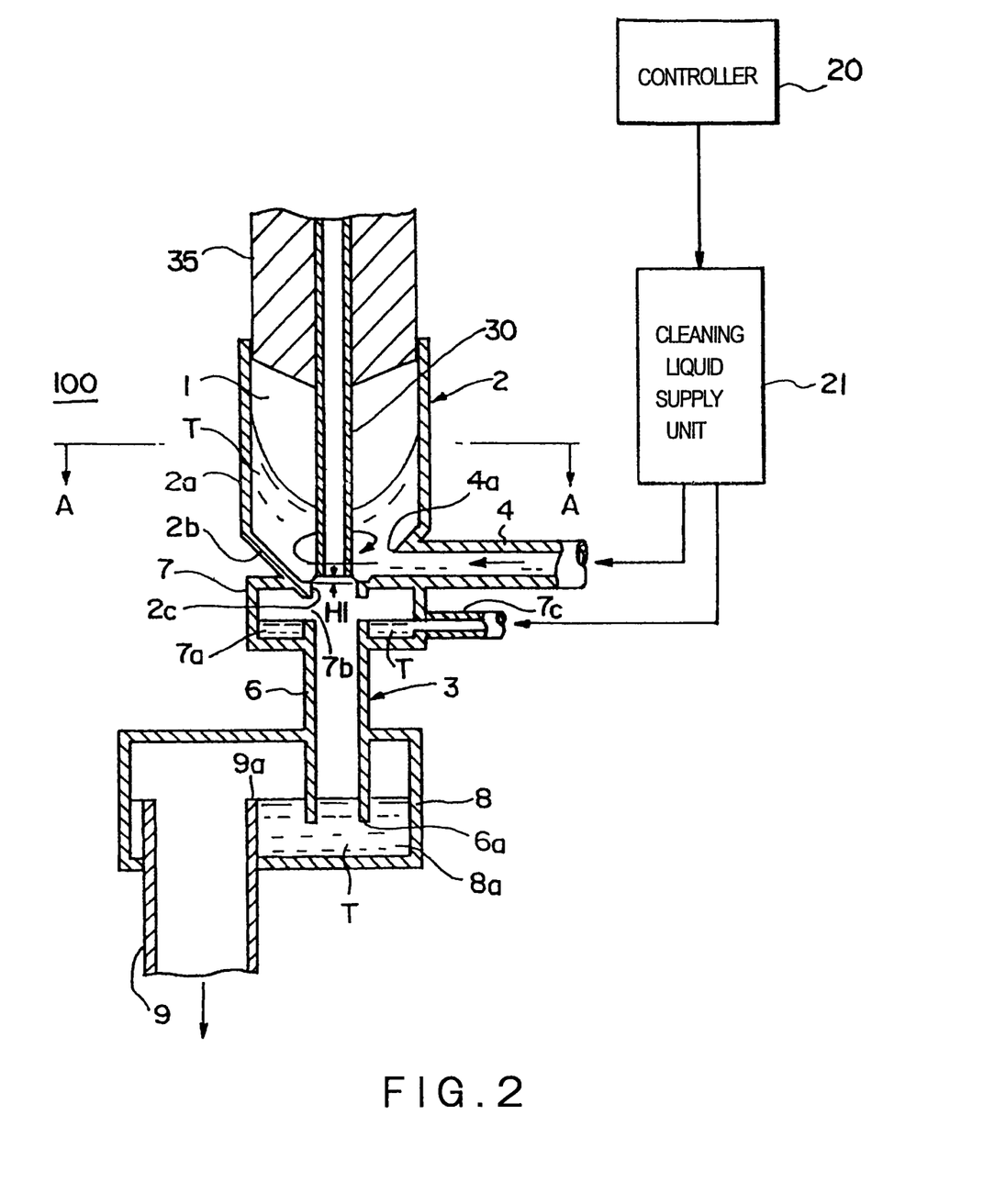
FIG. 2 is a longitudinal cross-sectional view schematically showing the nozzle cleaning apparatus in one embodiment of the present invention.

Next, the nozzle standby part 100, i.e., the nozzle cleaning apparatus (hereinafter referred to as "nozzle cleaning apparatus 100") is described in detail with reference to FIGS. 2 and 3. As shown in FIG. 2, the nozzle cleaning apparatus 100 includes: a cleaning container 2 adapted to accommodate the nozzle 30 therein and defining therein a substantially sealed cleaning chamber 1, when the distal end of the nozzle holder 35 is inserted into the cleaning container 2; and a solvent atmosphere creating structure 3 for creating a solvent atmosphere disposed below the cleaning container 2.

As shown in FIG. 2, the cleaning container 2 is formed of an upper cylindrical portion 2a and a lower funnel-shaped portion 2b having an inner surface of a funnel-like shape (in the illustrated embodiment, an inverted conical shape). The cleaning container 2 is formed to have dimensions such that, when the distal end of the nozzle holder 35 is inserted into the cylindrical portion 2a by a predetermined insertion amount, the tip of the nozzle 30 is positioned in a central lower portion of the funnel-shaped portion 2b. An opening 2c is formed in the lower end of the cleaning container 2, namely, the lower end of the funnel-shaped portion 2b. As shown in FIG. 3, the inner diameter L1 (for example, not more than 5 mm) of the opening 2c is larger than the outer diameter L2 (for example, 2.4 mm) of the tip of the nozzle 30. When the nozzle 30 is disposed in the cleaning container 2, the opening 2c and the tip of the nozzle 30 are positioned concentrically in plan view as shown in FIG. 3, and the tip of the nozzle 30 is positioned at a level higher than that of the upper end of the opening 2c as shown in FIG. 2. The distance H1 between the upper end of the opening 2c and the tip of the nozzle 30 is preferably between 0.5 mm and 2 mm.

Connected to the funnel-shaped portion 2b is a cleaning liquid supply pipe 4 for flowing a solvent T (e.g., thinner) as a cleaning liquid into the funnel-shaped portion 2b circumferentially along its inner surface of the funnel-like shape. Connected to the cleaning liquid supply pipe 4 is a cleaning liquid supply unit 21 that supplies the solvent T and stops the supply of the solvent T, according to a control command of a controller 20.

Figure 3:
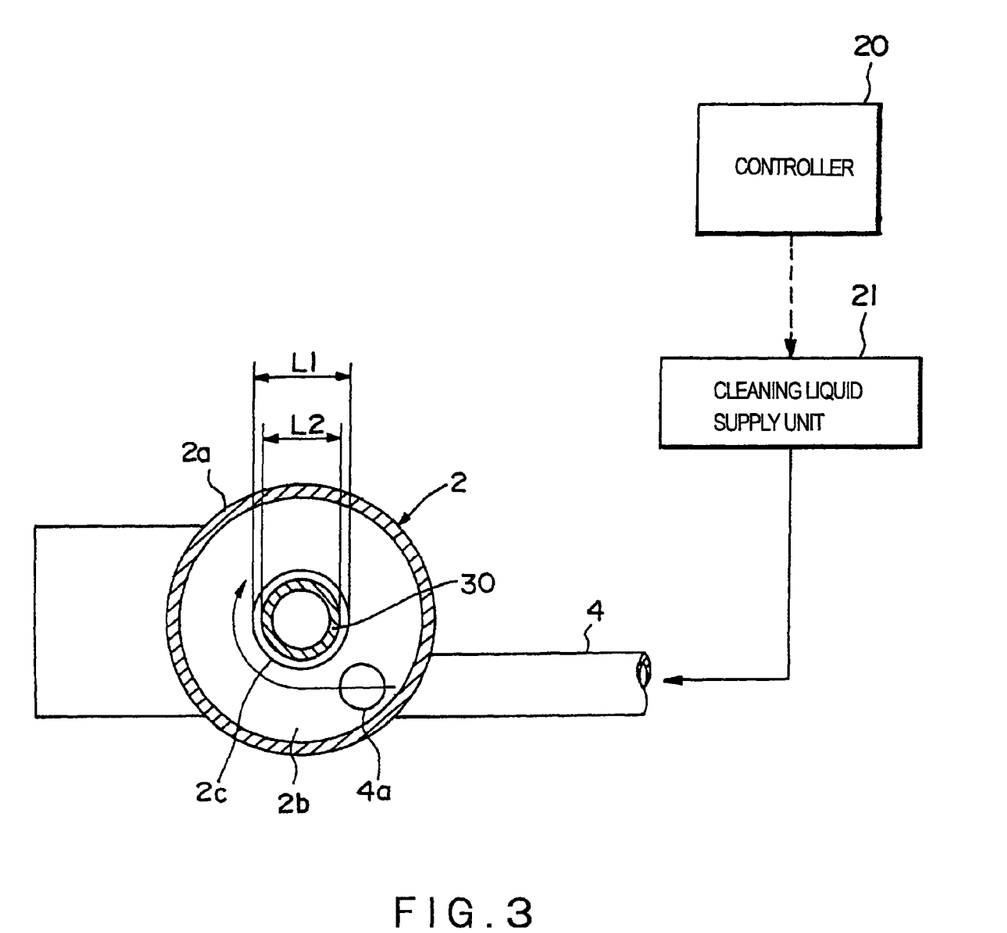
FIG. 3 is a cross sectional view of the nozzle cleaning apparatus taken along the A-A line in FIG. 2.

As shown in FIG. 3, a supply port 4a of the cleaning liquid supply pipe 4 formed in the inner surface of the funnel-shaped portion 2b is disposed such that the solvent T is discharged therefrom, not toward the nozzle 30, but along the inner surface of the funnel-shaped portion 2b. Thus, when the nozzle 30 is disposed in the cleaning container 2 and a predetermined amount of the solvent T is supplied at a predetermined flow rate from the supply port 4a into the cleaning chamber 1, the solvent T forms a vortex flow whirling around the nozzle 30, and flows out from the cleaning container 2 through a gap between the opening 2c and the tip of the nozzle 30. Due to the foregoing positional relationship between the opening 2c and the tip of the nozzle 30, a vortex which will not stagnate is formed around the tip of the nozzle, whereby the nozzle can be more effectively cleaned.

The solvent atmosphere creating structure 3 includes: a channel pipe 6 disposed below the cleaning container 2 and being in communication with the cleaning chamber 1 to serve as a draining path of the solvent T flowing out from the cleaning container 2; and a first solvent reservoir 8 disposed at a lower portion of the channel pipe 6 so as to store a predetermined amount of the solvent running down the channel pipe 6. The solvent atmosphere creating structure 3 further includes a second solvent reservoir 7 formed of a doughnut-like tube. The second solvent reservoir 7 is in communication with the interior space of the channel pipe 6 at an upper portion of the channel pipe 6.

The first solvent reservoir 8 has a liquid storing area 8a whose function is to store a predetermined amount of the solvent T running down the channel pipe 6. An upper end portion of a drain pipe 9 is inserted into the first solvent reservoir 8. When the liquid level of the solvent T in the first solvent reservoir 8 exceeds the upper end of the drain pipe 9, the solvent T overflows from the liquid storing area 8a to flow into the drain pipe 9, and is discharged through the drain pipe 9. Suction means for sucking the solvent in the drain pipe 9 may be disposed on the downstream side of the drain pipe 9. In this case, the solvent can be more effectively drained.

As shown in FIG. 2, the lower end 6a of the channel pipe 6 is positioned at a level lower than that of the upper end 9a of the drain pipe 9. In addition, the lower end 6a of the channel pipe 6 is positioned at a level lower than a maximum liquid level of the solvent T maximally contained in the liquid storing area 8a. Thus, when the liquid storing area 8a is fully filled with the solvent T, the lower end 6a of the channel pipe 6 is closed by the solvent T as illustrated, and the interior of the channel pipe 6 is hermetically sealed. Therefore, when the solvent T in the liquid storing area 8a inside the lower end of the channel pipe 6 is vaporized, a solvent vapor atmosphere is effectively formed in the cleaning chamber 1 which is in communication with the channel pipe 6.

As shown in FIG. 2, the second solvent reservoir 7 includes: a liquid storing area 7a having a predetermined depth; and a communication path 7b leading to the channel pipe 6 and allowing the solvent to overflow from the liquid storing area 7a into the channel pipe 6. A solvent supply path 7c is connected to the second solvent reservoir 7 at its lateral side to receive the solvent T from the cleaning liquid supply unit 21. Thus, the solvent T supplied from the solvent supply path 7c is stored in the liquid storing area 7a. The solvent T that has been vaporized in the second solvent reservoir 7, which is nearer the cleaning chamber 1 than the first solvent reservoir 8, more easily enters the cleaning chamber 1, whereby the solvent vapor atmosphere can be more effectively formed in the cleaning chamber 1.

The controller 20 comprises a multi-purpose computer, or a computer designed exclusively for the nozzle cleaning apparatus 100. The controller 20 includes a not-shown storage part which stores therein a nozzle cleaning program including one or more process recipe(s) of a software defining operations of the nozzle standby part 100, and a commanding part for conducting the respective operations based on any of the process recipes. By reading out the program and executing the same, the controller 20 generates a control signal to perform the below-described series of steps relating to the nozzle cleaning. The nozzle cleaning program may be stored in a storage medium such as a hard disk, a compact disk, a magnetooptical disk, and a memory card, and the storage medium may be stored in the storage part of the controller 20. The controller 20 may control operations of the whole resist coating system including the nozzle cleaning apparatus 100. Thus, the nozzle cleaning program may be a part of a program including the nozzle cleaning operation, for controlling operations of the whole resist coating system.

Next, a series of operations (control operations by the controller 20) while the nozzle is standing-by in the nozzle cleaning apparatus 100 as structured above are described with reference to the flowchart of FIG. 4 and the process charts of FIGS. 5 and 6.

Figure 4:
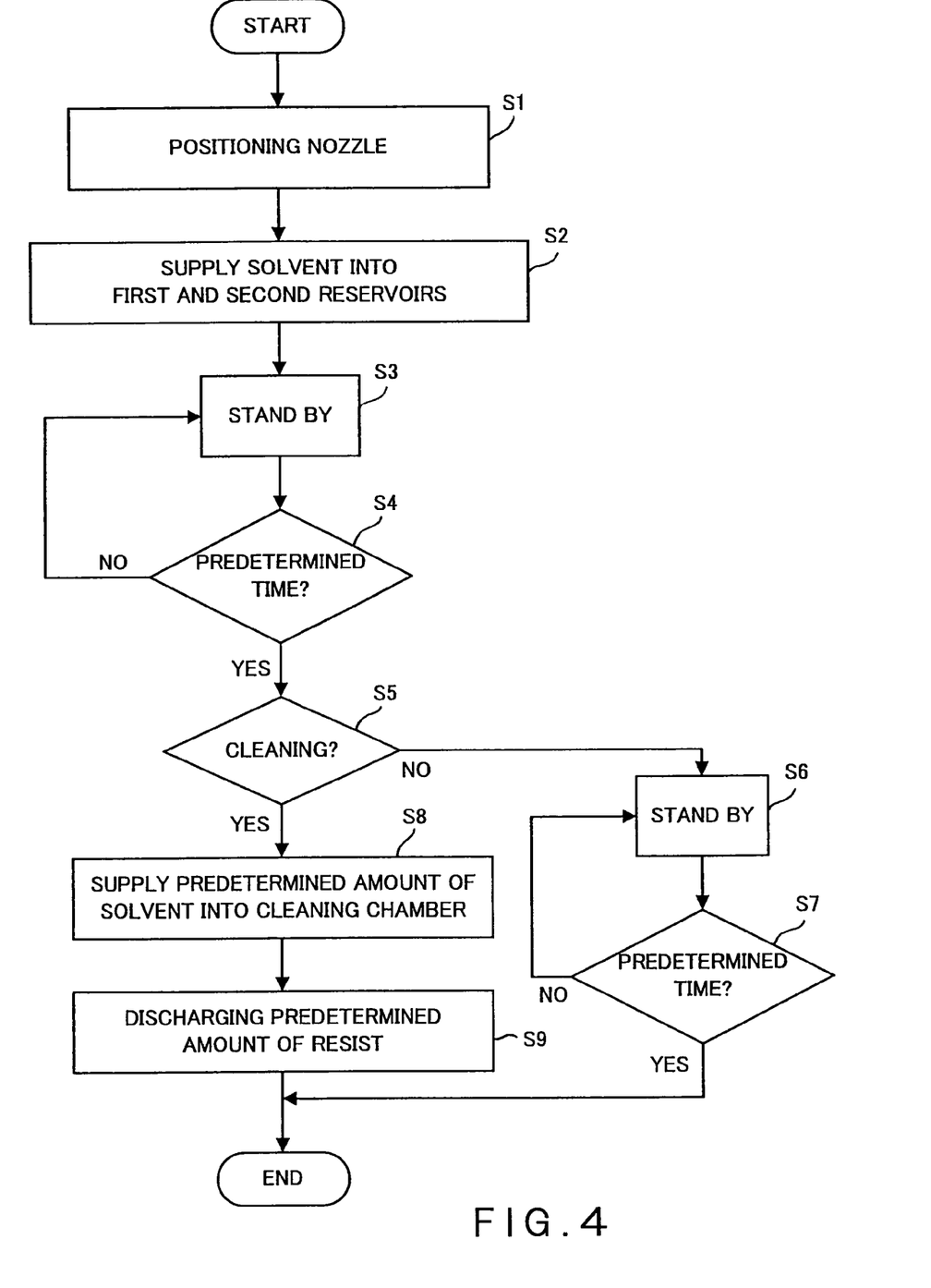
FIG. 4 is a flowchart explaining a series of steps performed in the nozzle cleaning apparatus shown in FIG. 2.

In the resist coating system COT, after a resist coating process for one wafer W is finished, the nozzle 30 is moved to be accommodated in the cleaning chamber 1 of the nozzle cleaning apparatus 100, by driving of the not-shown Y-direction driving mechanism and the vertical-direction driving mechanism (step S1 in FIG. 4). At this time, the nozzle 30 is positioned such that the positional relationship between the tip of the nozzle 30 and the opening 2c is as that shown in FIGS. 1 and 2.

Figure 5:
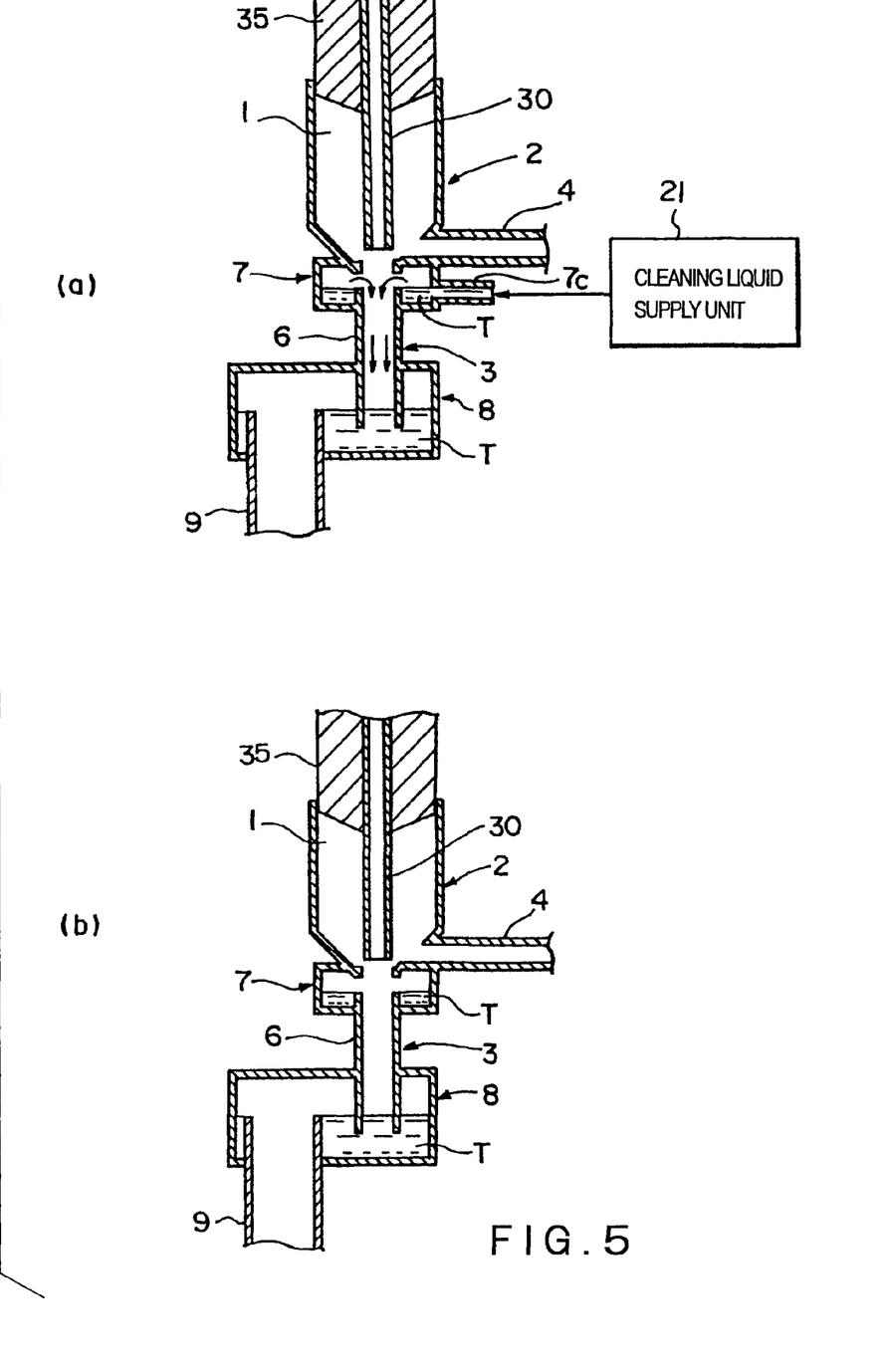
FIG. 5 shows longitudinal cross-sectional views of the nozzle cleaning apparatus as process charts explaining states of the nozzle standby part corresponding to some steps shown in the flowchart of FIG. 4.
Figure 6:
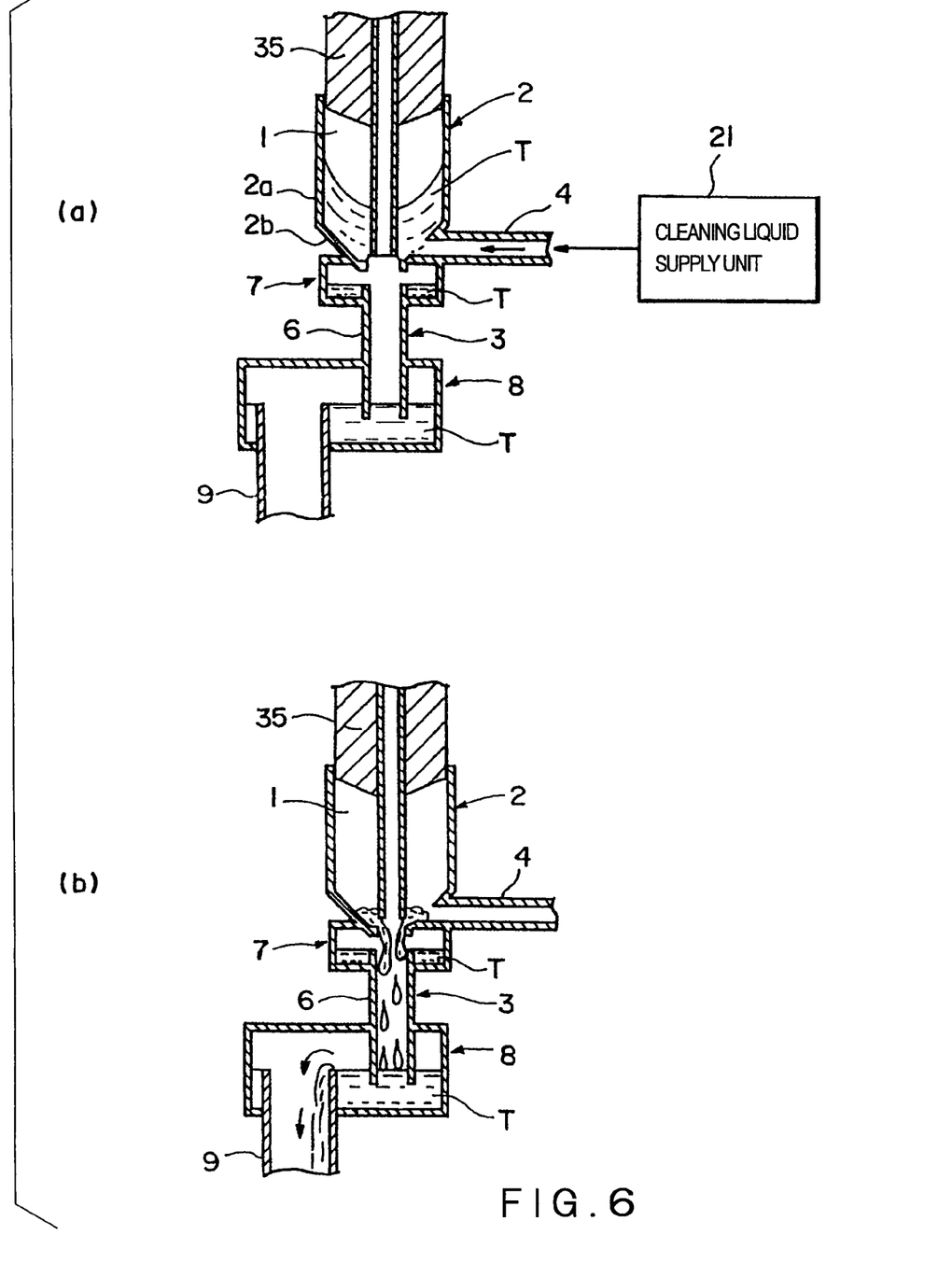
FIG. 6 shows longitudinal cross-sectional views of the nozzle cleaning apparatus as process charts explaining states of the nozzle standby part corresponding to some steps shown in the flowchart of FIG. 4.

As shown in FIG. 5(a), the solvent T is supplied from the cleaning liquid supply unit 21 into the second solvent reservoir 7 through the solvent supply path 7c, so as to fill the liquid storing area 7a with the solvent T. Further, the solvent T is allowed to overflow from the liquid storing area 7a to flow into the channel pipe 6, so that the solvent T is also stored in the liquid storing area 8a of the first solvent reservoir 8 (step S2 in FIG. 4). The order of the steps S1 and S2 is reversible.

Then, the nozzle 30 is maintained in a state as shown in FIG. 5(b). That is to say, the nozzle 30 in the state shown in FIG. 5(b) stands by for a predetermined period of time in the nozzle cleaning apparatus 100 as the nozzle standby part (steps S3 and S4 in FIG. 4). Since the interiors of the cleaning chamber 1 and the channel pipe 6 are substantially sealed spaces, a solvent vapor atmosphere is created in the cleaning chamber 1 due to vaporization of the solvent stored in the first and second liquid storing areas 7a and 8a. Thus, the nozzle 30 is allowed to stand by while drying and solidifying of the resist adhering to the nozzle 30 is prevented.

After the predetermined standby period, the nozzle 30 is cleaned according to need (step S5 in FIG. 4). When the nozzle is cleaned, as shown in FIG. 6(a), the solvent T of a predetermined amount is supplied at a predetermined flow rate from the cleaning liquid supply unit 21 into the cleaning liquid supply pipe 4, so as to form a vortex flow of the solvent T around the tip of the nozzle 30, i.e., in the funnel-shaped portion 2b, in the cleaning chamber 1 (step S8 in FIG. 4). The whirling solvent T gradually flows downward into the channel pipe 6 through the opening 2c formed in the lower end of the cleaning container 2. Since the nozzle 30 is exposed to the vortex flow of the solvent T, crystals of a resist adhering to the circumference of the nozzle 30 can be effectively, thoroughly removed.

Then, the supply of the solvent T into the cleaning chamber 1 is stopped, and thus the cleaning operation is completed. Thereafter, the valve 37 (see, FIG. 1) is opened so that a predetermined amount of the resist is discharged from the nozzle 30. Thus, the excessive solvent around the tip of the nozzle 30, which has adhered thereto during the cleaning operation, can be removed (step S9 in FIG. 4). After that, the nozzle 30 exits the cleaning container 2, and is used for the next resist coating process for the wafer W.

Upon completion of the cleaning of the nozzle 30, since the solvent T is stored in the first and second liquid storing areas 7a and 8a, the solvent vapor atmosphere of a predetermined concentration is created in the cleaning chamber 1. Thus, after the nozzle cleaning, the nozzle 30 may continuously stand by in the cleaning chamber 1 for a predetermined period of time until when the next resist coating process for the wafer W starts. At a suitable point of time (e.g., during or after the execution of the step S6) except at the execution of the step S2, the solvent T may be flown into the first solvent reservoir 8 and the second solvent reservoir 7 through the solvent supply path 7c, so as to replace the solvent stored in the reservoirs with a new solvent.

If the nozzle 30 is not to be cleaned (judgment of the step S5 in FIG. 4 is NO), the nozzle 30 stands by in the cleaning container 2 (steps S6 and S7 in FIG. 4) until the next resist coating process is performed.

Judgment in the step S5 (whether the nozzle is to be cleaned or not) may be conducted by detecting the actual condition of the nozzle, or may be conducted beforehand. In the latter case, it may be scheduled by a process recipe whether the nozzle is cleaned every time after one wafer W is processed or every time after a predetermined number of wafers W are processed.

Since the inner surface of a part of the cleaning container 2 located around the tip of the nozzle 30 is formed into a funnel-like shape, the space surrounding the nozzle becomes smaller toward the tip of the nozzle. Thus, during the nozzle standby step (step S3 in FIG. 4), if the solvent vapor concentration is high to cause formation of dew condensation of the solvent vapor, the solvent condenses at a portion near the tip of the nozzle. Thus, drying of the resist adhering to the nozzle can be more effectively prevented. Although dew drops are generated, no problem arises since the dew drops are removed in the succeeding step.

Figure 7:
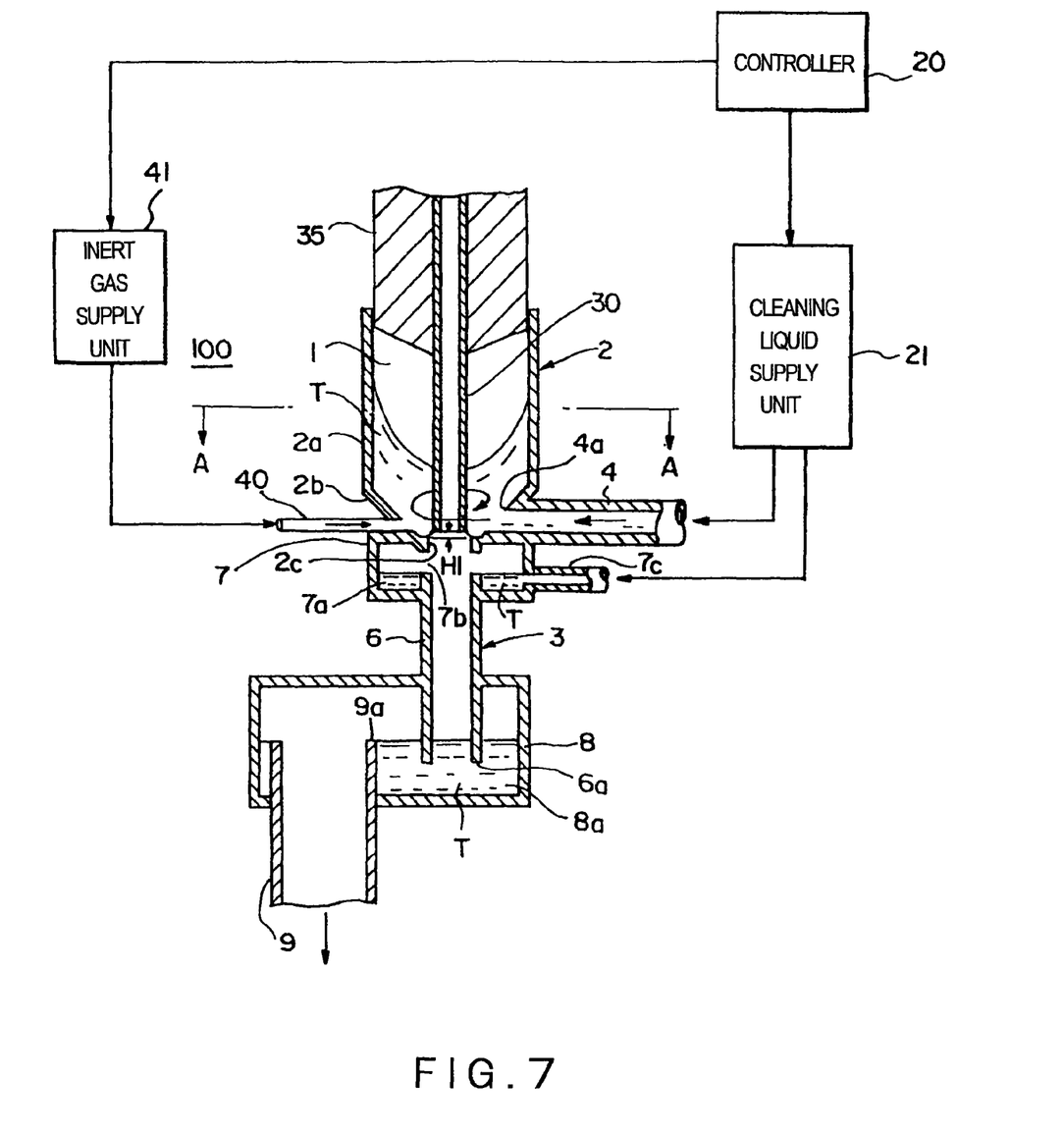
FIG. 7 is a longitudinal sectional view showing the nozzle cleaning apparatus in another embodiment.

As described later, a process liquid supplied from the nozzle 30 to a substrate (wafer) is not limited to a resist and may be another chemical liquid. Particles may precipitate due to contact between a certain type of chemical liquid and a solvent T (thinner). When such particles are supplied together with the chemical liquid to a substrate, the substrate may become defective. In a case where a nozzle for supplying such a chemical liquid is cleaned, an inert gas supply port 40 may be formed in the cleaning container 2 as shown in FIG. 7, and an inert gas may be supplied from an inert gas supply unit into the cleaning chamber 1 through the inert gas supply port 40 after the nozzle is cleaned. In this case, the tip of the nozzle can be promptly dried after the nozzle is cleaned, whereby precipitation of particles can be prevented. In place thereof or in addition thereto, a suction port (outlet port) may be provided in the cleaning container 2 to discharge the solvent atmosphere in the cleaning chamber 1 after the nozzle is cleaned, so that the same effect can be obtained.

According to the foregoing embodiment, the following advantageous effects can be obtained.

By cleaning the nozzle 30 with a vortex flow of the solvent T whirling around the tip of the nozzle, the tip of the nozzle can be effectively cleaned, and a substance adhering to the tip of the nozzle can be readily removed. Even if the position of the nozzle 30 in the cleaning chamber 1 is displaced to some degree, the cleaning efficiency is not degraded. In addition, since a vortex flow can be formed in the cleaning chamber by means of the single solvent discharge port, the structure of the apparatus can be simplified, reducing the apparatus cost.

Due to the provision of the solvent reservoirs 7 and 8 in communication with the cleaning chamber 1, the nozzle 30 can be placed in the solvent vapor atmosphere, when the nozzle 30 is not being cleaned. When the nozzle 30 is standing by in the nozzle cleaning apparatus, i.e., the nozzle standby part 100, drying of a resist can be prevented.

In the foregoing embodiment, the inner surface of the funnel-shaped portion 2b has an inverted conical shape. However, not limited thereto, the inner surface of the funnel-shaped portion 2b may be of a semispherical shape. A process object of the resist coating system incorporating the nozzle cleaning apparatus is not limited to a semiconductor wafer, but may be another substrate, such as an LCD substrate, which is processed by photolithography. In addition, a cleaning object is not limited to a nozzle for applying a resist, but may be a nozzle for discharging another process liquid to a substrate.

In the foregoing embodiment, the resist coating system COT includes the single nozzle 30. However, there may be a resist coating system (COT) including a plurality of nozzles (30) in which a nozzle scan arm (31) holds one nozzle selected from the plurality of nozzles to perform a resist coating process. In such a resist coating system, since the non-selected nozzles are detached from the nozzle scan arm and stands by in a nozzle standby part, i.e., a nozzle cleaning apparatus (100), it is difficult to locate each not-selected nozzle at a predetermined position (the position shown in FIG. 2) in a cleaning container (2) of the nozzle cleaning apparatus, by using a driving mechanism of the nozzle scan arm. In this case, for example, a tapered inner surface may be formed at an upper opening portion of the cleaning container, and a tapered outer surface complementary to the inner surface may formed at a nozzle holder (35). This enables positioning of the nozzle independent from the driving mechanism of the nozzle scan arm (see, the structure shown in FIG. 8). In this case, it is sufficient for the nozzle scan arm to just place the nozzle at a suitable position of the cleaning container. Not limited to the above complementary tapered surfaces, any means for positioning two members upon mutual contact or engagement, such as a step or steps formed in a cleaning container and/or the nozzle holder, or a positioning pin and a pin hole provided at the cleaning container and the nozzle holder, may be used as positioning means.

The invention claimed is:

1. A nozzle cleaning apparatus that cleans a nozzle for discharging a process liquid to a substrate, said apparatus comprising:
   a cleaning liquid supply unit that supplies a solvent as a cleaning liquid;
   a cleaning container accommodating the nozzle therein and defining therein a cleaning chamber, the cleaning container having a part thereof to be located around a tip of the nozzle accommodated in the cleaning container, the part of the cleaning container having an inner surface of a funnel-like shape; and
   a cleaning liquid supply path connected to the cleaning supply unit and having a supply port opening into the cleaning chamber, wherein the supply port has a center axis extending substantially horizontally, and an extension of the center axis of the supply port does not intersect with the nozzle accommodated in the cleaning container as viewed from the above,
   whereby the solvent flows along the inner surface of the funnel-like shape so as to form a vortex of the solvent whirling around the nozzle.

2. The nozzle cleaning apparatus according to claim 1, wherein an opening for draining the solvent is formed in a bottom portion of the cleaning container, and wherein an inner diameter of the opening is larger than an outer diameter of the tip of the nozzle.

3. The nozzle cleaning apparatus according to claim 2, further comprising means for positioning the tip of the nozzle at a level higher than that of an upper end of the opening, when the nozzle is accommodated in the cleaning container.

4. The nozzle cleaning apparatus according to claim 3, further comprising a solvent atmosphere creating structure that creates a solvent atmosphere in the cleaning chamber,
   wherein the structure includes: a channel pipe, disposed below the cleaning container and being in communication with the opening of the cleaning container, through which the solvent drained from the cleaning container flows; and a first solvent reservoir disposed at a lower portion of the channel pipe and adapted to store the solvent, which is flown into the first solvent reservoir from the channel pipe, at a level higher than that of a lower end of the channel pipe, whereby a solvent stored in the first solvent reservoir may be vaporized to enter the cleaning chamber so that a solvent atmosphere is created in the cleaning chamber.

5. The nozzle cleaning apparatus according to claim 4, wherein the solvent atmosphere creating structure includes a second solvent reservoir disposed above the first solvent reservoir and being in communication with the channel pipe, and wherein the cleaning liquid supply unit is adapted to supply the solvent also to the second solvent reservoir.

6. The nozzle cleaning apparatus according to claim 1, wherein the cleaning container has an inner surface which defines the cleaning chamber and comprises a surface of revolution having a center axis, and wherein the extension of the center axis of the supply port does not intersect with the center axis of the surface of revolution.

7. The nozzle cleaning apparatus according to claim 1, wherein the supply port opens into the cleaning chamber at the inner surface of the funnel-like shape.

8. A nozzle cleaning apparatus that cleans a nozzle that discharges process liquid to a substrate, said apparatus comprising:
   a cleaning liquid supply unit that supplies a solvent as a cleaning liquid;
   a cleaning container accommodating the nozzle therein and defining a cleaning chamber therein, the cleaning container having a part thereof to be locatable around a tip of the nozzle, and having an inner surface of a funnel-like shape; and
   a cleaning liquid supply path, connected to the cleaning liquid supply unit, and having a a supply port opening into the cleaning chamber,
   wherein the supply port opens into the cleaning chamber at the inner surface of the funnel-like shape,
   wherein the supply port has a center axis, and an extension of the center axis of the supply port does not intersect with the nozzle as viewed from above, and whereby the solvent flows along the inner surface of the funnel-like shape so as to form a solvent vortex whirling around the nozzle,
   wherein the cleaning container has an inner surface which defines the cleaning chamber and comprises a surface of revolution having a center axis,
   wherein the extension of the center axis of the supply port does not intersect with the center axis of the surface of revolution, and
   wherein the center axis of the supply port extends substantially horizontally.

9. The nozzle cleaning apparatus according to claim 3, wherein the nozzle positioning means comprises a nozzle moving mechanism configured to hold the nozzle and configured to move the nozzle horizontally and vertically, or a configuration having a first member on the nozzle and a second member on the cleaning container which mutually engage or contact with each other to position the nozzle.

* * * * *